United States Patent
Baum et al.

[11] Patent Number: 5,898,269
[45] Date of Patent: Apr. 27, 1999

[54] ELECTRON SOURCES HAVING SHIELDED CATHODES

[75] Inventors: Aaron W. Baum, San Francisco, Calif.; James Edward Schneider, Jr., Fairfield, Ohio

[73] Assignee: The Board of Trustees of the Leland Stanford Jr. University, Stanford, Calif.

[21] Appl. No.: 08/863,493

[22] Filed: May 27, 1997

Related U.S. Application Data

[63] Continuation-in-part of application No. 08/499,945, Jul. 10, 1995, Pat. No. 5,684,360.

[51] Int. Cl.$^6$ .................................................. H01J 40/06
[52] U.S. Cl. ......................... 313/542; 313/530; 313/541; 313/539; 313/544
[58] Field of Search ..................... 313/524, 530, 313/541, 542, 544, 539, 523, 336, 309, 351; 250/211 R, 214 VT, 423 P, 492.2, 492.24

[56] References Cited

U.S. PATENT DOCUMENTS

| | | | |
|---|---|---|---|
| 4,460,831 | 7/1984 | Oettinger et al. | 250/492.2 |
| 4,820,927 | 4/1989 | Langner et al. | 250/492.2 |
| 4,868,380 | 9/1989 | Booman et al. | 250/211 R |
| 4,906,894 | 3/1990 | Miyawaki et al. | 313/542 |
| 4,970,392 | 11/1990 | Oettinger et al. | 250/423 P |
| 5,039,862 | 8/1991 | Smith et al. | 250/432 P |
| 5,594,296 | 1/1997 | Mitsutake et al. | 313/309 |

OTHER PUBLICATIONS

Colin A. Sanford, Doctoral Thesis, Cornell University Dept. of Electrical Engineering May (1990), Entitled: Laser Pulsed GaAs Negative Electron Affinity Photocathodes for Electron Beam Instrumentation.

*Primary Examiner*—Nimeshkumar D. Patel
*Attorney, Agent, or Firm*—Stanley Z. Cole; William McClellan

[57] ABSTRACT

An electron beam source includes a cathode having an electron emission surface including an active area for emission of electrons and a cathode shield assembly including a conductive shield disposed in proximity to the electron emission surface of the cathode. The shield has an opening aligned with the active area. The electron beam source further includes a device for stimulating emission of electrons from the active area of the cathode, electron optics for forming the electrons into an electron beam and a vacuum enclosure for maintaining the cathode at high vacuum. The cathode may be a negative electron affinity photocathode formed on a light-transmissive substrate. The shield protects non-emitting areas of the emission surface from contamination and inhibits cathode materials from contaminating components of the electron beam source. The cathode may be moved relative to the opening in the shield so as to align an new active area with the opening. Getter materials and sources of activation material may be incorporated into the shield assembly.

26 Claims, 5 Drawing Sheets

ELECTRON SOURCES HAVING SHIELDED CATHODES

CROSS REFERENCE TO RELATED APPLICATION

This application is a continuation-in-part of pending application Ser. No. 08/499,945 filed Jul. 10, 1995, now U.S. Pat. No. 5,684,360.

FIELD OF THE INVENTION

This invention relates to electron beam sources and, more particularly, to electron sources wherein a shield is positioned in front of a broad area cathode. The shield has an opening aligned with the active area of the cathode to permit emission of electrons into an electron beam column.

BACKGROUND OF THE INVENTION

High resolution electron beam systems include scanning electron microscopes, defect detection tools, VLSI testing tools and mask making and wafer exposure tools. In general, these systems include an electron source and electron optics for accelerating the electrons into an electron beam and focusing the electrons onto a target. These systems require an electron source with a high brightness and a small source size. Field emission electron sources have frequently been used in high resolution electron beam systems.

Negative electron affinity (NEA) photocathode electron sources have been proposed in the prior art. A negative electron affinity photocathode includes a semiconductor, usually a III-V compound such as gallium arsenide, heavily p-doped so as to raise the conduction band relative to the Fermi level. The semiconductor surface is coated with an activation layer a few monolayers thick, which lowers the work function so that the conduction band in the bulk is above the vacuum level, a condition of negative electron affinity. When electrons are excited by light energy into the conduction band within a diffusion length (typically a few micrometers) of the surface, many of them will diffuse to the surface where they will have a high probability of escaping into the vacuum, as described by R. L. Bell in *Negative Electron Affinity Devices*, Clarendon Press, New York, 1973.

In operation, a small diameter light beam illuminates an active area of the cathode, causing electrons to be emitted. Typically, a high brightness electron source is achieved by providing a small active emission area on the cathode. The active emission area is usually small in comparison with the total area of the emission surface of the cathode. Cathodes of this type, wherein electrons are emitted from a relatively small active area of a relatively large area cathode, are referred to herein as broad area cathodes.

In many cases, a broad area cathode is highly sensitive to contamination and may provide only limited lifetime when exposed to the many sources of contamination in an electron beam source. The replacement of a cathode in an electron beam system is frequently a lengthy, risky process, so that longer periods of operation with a cathode represent a significant technical advantage.

In a high vacuum or ultra high vacuum system, contamination of a cathode can arise from several sources, including: (1) normal outgassing, consisting of desorption of gases from surfaces within the system and diffusion of gases from the interior of objects in the system; (2) electron-stimulated desorption in which electrons striking a surface causes gases to be released, both as ions and as neutral particles; and (3) backstreaming of gases from parts of the system at poorer vacuum levels. In an electron beam column, all three of these sources create gases that may contaminate the cathode. The emission surface of the cathode cannot be completely physically shielded from the sources of contamination, because the electrons must pass from the emitting area to the column. It is possible to create electric fields that block most ions from reaching the cathode. It is also possible to use a sector magnet in the electron beam column to eliminate line-of-sight between the cathode and most sources of neutral contaminants. However, both approaches, particularly the sector magnet, add considerable complexity and expense to the system.

A further problem with NEA photocathodes relates to the cesium that is typically used to activate the photocathode surface. Cesium that migrates from the cathode to other parts of the electron beam column facilitates electrical breakdown of insulators and lowers the work functions of almost all materials, thereby increasing the risk of vacuum electrical breakdown between electrodes at different voltages.

Prior art electron beam columns have utilized an anode with a fairly large opening directly over the cathode. However, because of the voltage applied and the limitations on the maximum electric field that can be applied, the anode-cathode distance is such that very little shielding from the cathode from the column is effected and, in any case, the cathode is not protected from arcs, ions, gases released by ions, dark current and electrons emitted due to stray light. Furthermore, any cesium or other activating material is not contained in the region around the cathode surface, and insulators are not protected.

A scanned electron beam system, including an electron beam source using an NEA activated photoemitter as the cathode, is disclosed in U.S. Pat. No. 4,820,927 issued Apr. 11, 1989 to Langner et al. In the disclosed electron source, the anode is located directed above the cathode, so that a strong positive field is applied to non-emitting areas of the cathode. The non-emitting areas are exposed to virtually the same contamination as the emitting area. Electron beam sources utilizing photocathodes are also disclosed in U.S. Pat. No. 4,460,831 issued Jul. 17, 1984 to Oettinger et al; U.S. Pat. No. 4,970,392 issued Nov. 13, 1990 to Oettinger et al; U.S. Pat. No. 5,039,862 issued Aug. 13, 1991 to Smith et al; and U.S. Pat. No. 4,906,894 issued Mar. 6, 1990 to Miyawaki et al.

In the disclosed electron sources, the emitting and non-emitting areas of the cathode are exposed to contamination, and components of the electron beam source, such as insulators and electrode surfaces, may be contaminated by cathode materials. It is desirable to provide electron beam sources wherein these problems and disadvantages are overcome.

SUMMARY OF THE INVENTION

According to the present invention, an electron beam source comprises a broad area cathode having an electron emission surface, including an active area for emission of electrons, and a cathode shield assembly comprising a conductive shield disposed in proximity to the electron emission surface of the cathode. The shield has an opening aligned with the active area. The electron beam source further comprises means for stimulating emission of electrons from the active area of a cathode, electron optics for forming the electrons emitted from the active area of the cathode into an electron beam and a vacuum enclosure for maintaining the cathode at high vacuum.

The shield protects non-emitting areas of the emission surface from contamination. In addition, the shield inhibits cathode materials from contaminating components of the electron beam source.

In one embodiment, the shield is biased at a potential approximately equal to the potential of the cathode. In another embodiment, the shield is biased at a potential that is more negative than the potential of the cathode.

The cathode preferably comprises a negative electron affinity photocathode formed on a light-transmissive substrate. In this case, the means for stimulating may comprise a light beam generator for directing a light beam through the light-transmissive substrate at the active area of the photocathode.

According to a feature of the invention, the electron beam source may further include means for moving the cathode relative to the opening in the shield so as to align a new active area with the opening. The cathode may be moved one or more times when the active area becomes contaminated or performance is otherwise degraded. As a result, the life of the cathode is extended.

According to another feature of the invention, the shield assembly may include a getter material on a surface of the shield facing the cathode. The getter material may be selected from the group consisting of cesium, zirconium matrix non-evaporable getter, titanium and combinations thereof.

According to a further feature of the invention, the shield assembly may include a source of activation material for providing activation material to the electron emission surface of the cathode. The source of activation material may comprise a cesium source.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
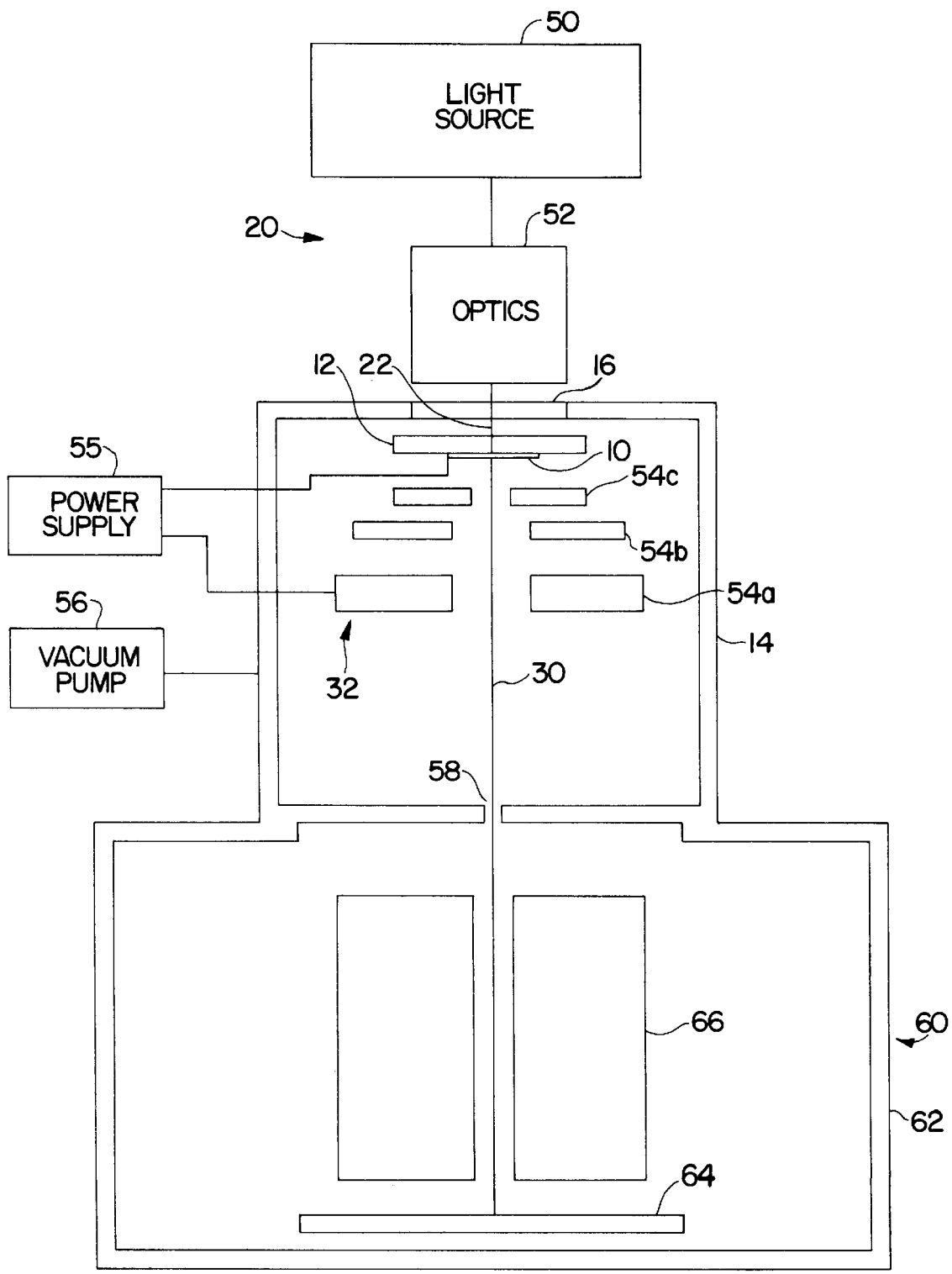
FIG. 1 is a block diagram of an example of an electron beam system utilizing an electron beam source in accordance with the present invention.
Figure 2:
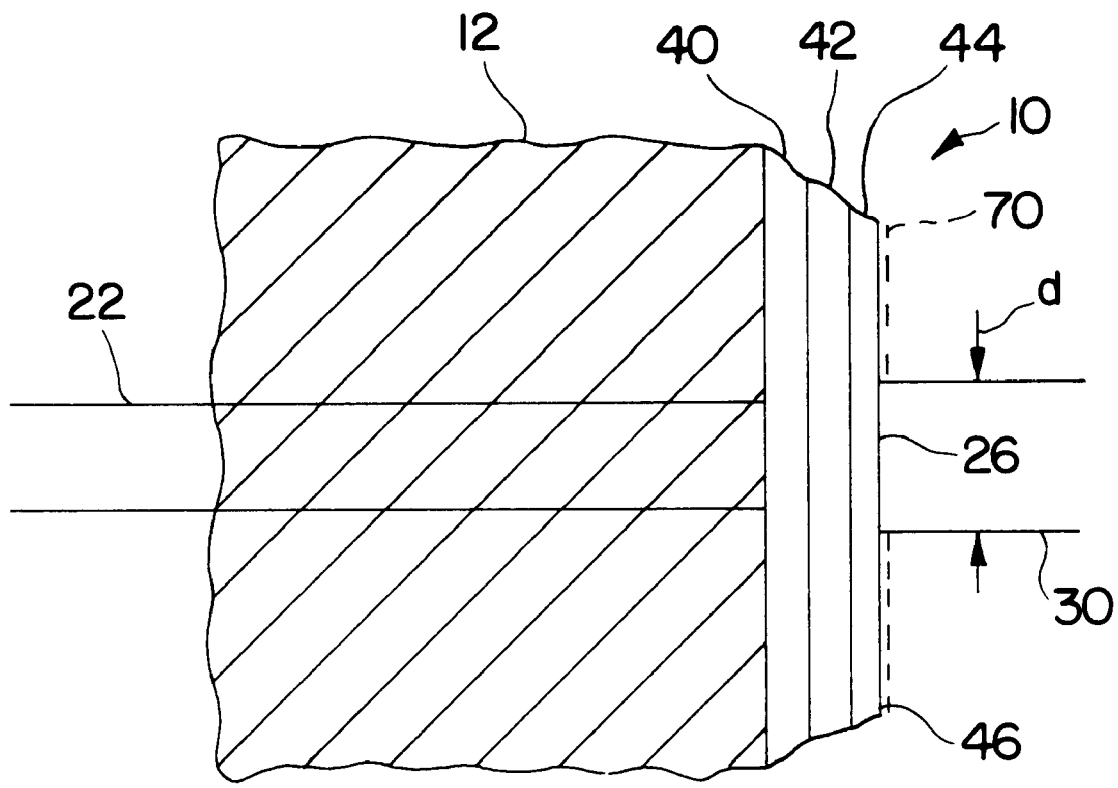
FIG. 2 is a partial cross-sectional view of the photocathode in the electron beam source of FIG. 1.

A block diagram of an example of an electron beam system utilizing an electron beam source in accordance with the present invention is shown in FIG. 1. A photocathode 10 is located on a surface of a light-transmissive substrate 12. An enlarged partial cross-sectional view of substrate 12 and photocathode 10 is shown in FIG. 2. The photocathode 10 is located within a vacuum enclosure 14 that maintains an ultra high vacuum environment during operation. The vacuum enclosure 14 includes a vacuum window 16 for transmission of a light beam as described below. In an alternative configuration, the light-transmissive substrate 12 may form part of the vacuum enclosure wall. A light beam generator 20 directs a light beam 22 through vacuum window 16 and substrate 12 to an active emission area 26 (see FIG. 2) of photocathode 10. The light beam 22 causes the active emission area of 26 of photocathode 10 to emit electrons into the vacuum region defined by vacuum enclosure 14. The electrons are formed into an electron beam 30 by electron optics 32.

The active emission area 26 of photocathode 10 has a small dimension d parallel to the surface of photocathode 10 to achieve high brightness. The active area 26 is typically more or less circular in shape, but is not limited to a circular shape. For example, the active area 26 may be in the form of a line, where the line width has a dimension d as described above. Additionally, the active area may comprise a predetermined pattern on photocathode 10. The photocathode 10 may have one active emission area 26 as shown in FIG. 2 and described above. Alternatively, the photocathode 10 may have two or more active emission areas 26. The active emission area is the area of the photocathode from which electrons are emitted, whereas an emission surface includes emitting areas and non-emitting areas. The photocathode 10 typically has an electron emission surface that is large in comparison with the active emission area 26. Thus, the ratio of the emitting area to the non-emitting area is typically small.

The active emission area 26 of photocathode 10 may be defined in two ways. In a first approach, the active emission area is defined by and is a direct result of light beam 22. Typically, the dimension d of the active area 26 is approximately equal to the cross sectional diameter of the light beam 22. The active area 26 of electron emission may be somewhat larger than light beam 22 due to lateral spreading of electrons within photocathode 10. In this approach, movement of the light beam 22 causes the active area 26 to move relative to photocathode 10.

In a second approach, the active emission area 26 is predefined by surface modification of photocathode 10. For example, the photocathode 10 may be coated with a thin blocking layer, such as aluminum, having at least one opening that defines active area 26. In an alternative approach, photocathode 10 may be subjected to ion implantation over its surface area except in one or more active areas. The ion implantation produces defects in the photocathode material, which reduce its effectiveness as an electron emitter. When the active area 26 is defined by surface modification of the photocathode, electron emission is caused by light beam 22. However, the active area 26 is fixed in position with respect to photocathode 10. In addition, since the dimension of the active area 26 is defined by surface modification, the light beam 22 is not required to be as small as the active area 26. A pattern of active emission areas may be predefined by surface modification. One or more of the patterned active emission areas may be stimulated to emit electrons by directing a light beam at the active area. Furthermore, the light beam may be directed at different active emission areas in succession, as the active areas become contaminated or otherwise degrade in performance.

The photocathode 10 may be a negative electron affinity photocathode. The photocathode comprises a semiconductor, usually a Column III-V compound such as gallium arsenide, heavily p-doped ($1-5 \times 10_{19}$) with a material such as zinc, magnesium, or carbon, so as to raise the conduction band relative to the Fermi level. The cleaned semiconductor surface is exposed to cesium and oxygen to form an activating layer a few monolayers thick. The activation layer lowers the work function so that the conduction band in the bulk is above the vacuum level, the condition of negative electron affinity. When electrons are excited from the valence band into the conduction band within a diffusion length (typically a few micrometers) of the surface, many of the electrons diffuse to the surface, where they have a high probability of escaping the surface into the vacuum.

In general, the photocathode may be any material that meets the negative electron affinity condition specified above. The photocathode is typically a semiconductor material. Compounds of Column III materials such as gallium, aluminum and indium and Column V materials such as phosphorous, arsenic and nitrogen are typically used. Other suitable NEA materials include diamond, silicon carbide, aluminum nitride and gallium nitride. Some NEA materials may not require an activation layer. Alternatively, the activation layer may be formed by exposure to cesium only or cesium and nitrogen trifluoride. Other potentially low work function materials may also be used. The photocathode 10 is preferably very thin to limit lateral spreading of electrons within the photocathode, which would increase the dimension of the active area 26. Preferred thicknesses of cathode 10 are about one micrometer or less.

The photocathode 10 may optionally include a bandgap ramp which produces an electric field through the thickness of the photocathode. Bandgap ramps are described generally in U.S. Pat. No. 3,631,303 issued Dec. 28, 1971 to Antypas et al. The bandgap ramp may be produced by a density gradient in a constituent of the photocathode material. For example, an aluminum gallium arsenide photocathode may have a variable density of aluminum through its thickness. The purpose of the electric field within the photocathode material is to direct electrons toward the photocathode surface into the vacuum and to limit lateral movement of electrons within the photocathode material. As indicated, lateral movement of electrons tends to increase the lateral dimension of the active emission area of photocathode 10.

An example of a suitable photocathode 10 is described with reference to FIG. 2. An anti-reflection coating 40 is affixed to the surface of light-transmissive substrate 12. The substrate 12 should be substantially transparent to the wavelength or wavelengths of the light beam 22. A preferred substrate is glass. The anti-reflection coating is made of one or more layers of material with thicknesses and refractive indices chosen to minimize reflection of the illuminating light at the interface between the substrate glass and the cathode structure. Suitable anti-reflection coatings include silicon nitride and silicon oxynitride having a thickness of one quarter of the excitation wavelength. The photocathode 10 includes a diffusion blocking layer 42 on anti-reflection coating 40, followed by an active layer 44 having a surface activation layer 46. In a preferred embodiment, the diffusion blocking layer 42 comprises an AlGaAs or AlGaAsP layer having a thickness, typically from approximately 400 angstroms to a few micrometers, that minimizes absorption at the illuminating wavelength while forming an energy barrier to the diffusion of electrons in the conduction band of the active layer without promoting their recombination. The active layer comprises GaAs, GaAsP, AlGaAs or InGaAsP having a thickness of about one micrometer or less, and the activation layer 46 comprises $Cs_xO_y$ that is a few atomic layers thick.

The photocathode is maintained at ultra high vacuum so that the activating layer is not contaminated and maintains its integrity for a reasonable period of time. Contamination of the activating layer can reduce its effectiveness at lowering the work function of the cathode, possibly reducing or eliminating the condition of negative electron affinity. The vacuum level discussed in connection with negative electron affinity photocathodes is the minimum energy of an electron just above the surface of the cathode; an electron inside the photocathode with an energy less than this value cannot escape and will be trapped at the surface, where it will contribute to the surface trapped electron density.

The light beam generator 20 includes a light source 50 for generating light of a desired wavelength and intensity, and optics 52 for focusing the light into a small diameter beam at the surface of photocathode 10. The light source 50 may comprise a laser or a broadband light source. The broadband light source may include a suitable optical filter to produce light of a desired wavelength or wavelength range. For photocathodes fabricated of Column III-V materials, the wavelength is typically in the range of 300–800 nanometers. The selected wavelength depends on the absorption band of the photocathode material to excite electrons to the conduction band and on the thickness of the photocathode. The power level of the light source 50 is relatively low. Typically, power levels less than 10 milliwatts are required for excitation of photocathode 10. The optics 52 converts the light generated by source 50 into light beam 22 having a desired very small cross-sectional dimension at photocathode 10. As indicated above, the cross-sectional dimension of light beam 22 is preferably less than about 20 micrometers. This dimension may be achieved using a system of two or more lenses for focusing the image of an aperture on the photocathode, using a high numerical aperture, for minimum diffraction-limited spot size on the active region 26 of photocathode 10. The optics 52 may incorporate correction for spherical aberration of the vacuum window 16 and the substrate 12. The nominal diffraction-limited spot size for an optical system that is fully corrected for spherical and other aberrations is: diameter=wavelength/(2×NA), where NA is the numerical aperture, which is defined as the sine of the semi-angle of convergence of the beam times the refractive index of the medium in which the focusing is taking place. The preferred numerical aperture is at least 0.5.

The transmission configuration illustrated in FIG. 1 wherein the light beam 22 is transmitted through substrate 12 to one side of photocathode 10 and the electron beam 30 is emitted from the other side of photocathode 10, is advantageous in achieving a very small active area 26. In particular, the transmission configuration permits the final lens of the optics to be positioned close to the photocathode 10 and to have a large numerical aperture, thus permitting light beam 22 to have a very small diameter.

The vacuum enclosure 14 is connected through a suitable conduit to a vacuum pump 56 or a combination of vacuum pumps for maintaining the interior of enclosure 14 at ultra high vacuum, typically less than $10^{-9}$ torr. Typically, the required vacuum level may be in a range of $10^{-10}$ to $10^{-11}$ torr. The vacuum window 16 through which light beam 22 passes preferably has very low optical aberrations. The vacuum window 16 may be flat or may be in the form of a lens for further focusing of the light beam 22 from optics 52. The vacuum window 16 should be substantially transparent to the wavelength or wavelengths of light beam 22. The vacuum enclosure 14 includes a diffusion-limiting aperture 58 for limiting the rate of movement of contaminants from the main electron beam column into the electron source region. The electron optics 32 may include one or more electrodes, such as electrodes 54a, 54b, 54c, connected to a power supply 55 which suitably biases the electrodes for forming electron beam 30.

The electron beam 30 passes through aperture 58 into main electron beam column 60. The electron beam column includes a vacuum enclosure 62, a stage 64 for mounting a workpiece, such as a semiconductor wafer, and electron optics 66. The electron beam column in general incorporates all equipment necessary to create a vacuum for the application, to form the electron beam into a probe appropriate for the application, to scan the beam across the workpiece, to collect electrons or other particles scattered from the workpiece, to translate the workpiece and any other functions that may be required for the application. Techniques for the design and fabrication of electron beam columns are generally known to those skilled in the art.

The electron beam source comprises the photocathode 10 on substrate 12, light beam generator 20, vacuum enclosure 14 and electron optics 32. The electron beam source also includes a cathode shield as described in detail below. The electron beam source may include additional features such as a load lock (not shown) for replacement of photocathodes and an activation region (not shown) for heat cleaning and activation of the photocathode.

As indicated previously, the active area 26 of photocathode 10 for electron emission can be established by the light beam 22 itself or by modification of the surface of the photocathode 10 to establish one or more predefined active areas. The basic idea of using surface modification to limit the active electron emission area is to alter the surface or near surface structure of the photocathode, so that electrons are emitted only from a predefined area. By using high resolution lithographic techniques, the active areas may have much finer structure than is possible by defining the active areas with the light beam. For example, active areas for emission of electrons smaller than 0.1 micrometer may be fabricated. In addition, it is advantageous if the material on the non-emitting surface is efficient at collecting and eliminating the surface-trapped charge, thereby reducing the possibility of cutoff due to the surface-trapped electrons.

One approach is to use a metal layer 70, shown in phantom FIG. 2, deposited on the surface of photocathode 10 or grown into the structure close to the surface or on the surface. The metal layer 70, which may be aluminum, is provided with an opening of dimension that corresponds to the desired dimension d of active emission area 26. The metal layer blocks emission from the covered areas and conducts away the trapped charge more efficiently than bare semiconductor material. Other materials, such as other semiconductors or semimetals, may be deposited on the surface or grown into the structure to block emission of electrons except from a limited active area. Ohmic contacts may be used to define the active emission area.

The area of photocathode 10 which is not to emit electrons may be treated in other ways, such as ion implantation, to alter material properties to thereby prevent electrons from being emitted from these areas. The ion implantation may produce a high density of defects in the non-emitting regions, which prevents electron emission and speeds recombination of surface trapped electrons which entered into the treated region.

According to the present invention, the electron beam source is provided with a shield positioned in proximity to the electron emission surface of the photocathode. The shield has an opening aligned with the active emission area of the photocathode and is positioned in spaced relationship to the emission surface of the photocathode. Thus, the shield protects all but the active emission area of the photocathode against contamination from the contamination sources described above. Furthermore, the shield prevents cathode materials, such as cathode activation materials, from contaminating components of the electron beam column. The shield is preferably used with a broad area cathode wherein the active emission area is a relatively small fraction of the total area of the emission surface. Thus, when the active emission area of the photocathode becomes contaminated or otherwise degrades in performance, the photocathode can be translated relative to the light beam and the shield so as to define a new active emission area. The cathode movement can be repeated multiple times for a broad area photocathode, thereby extending the life of the photocathode.

Figure 3:
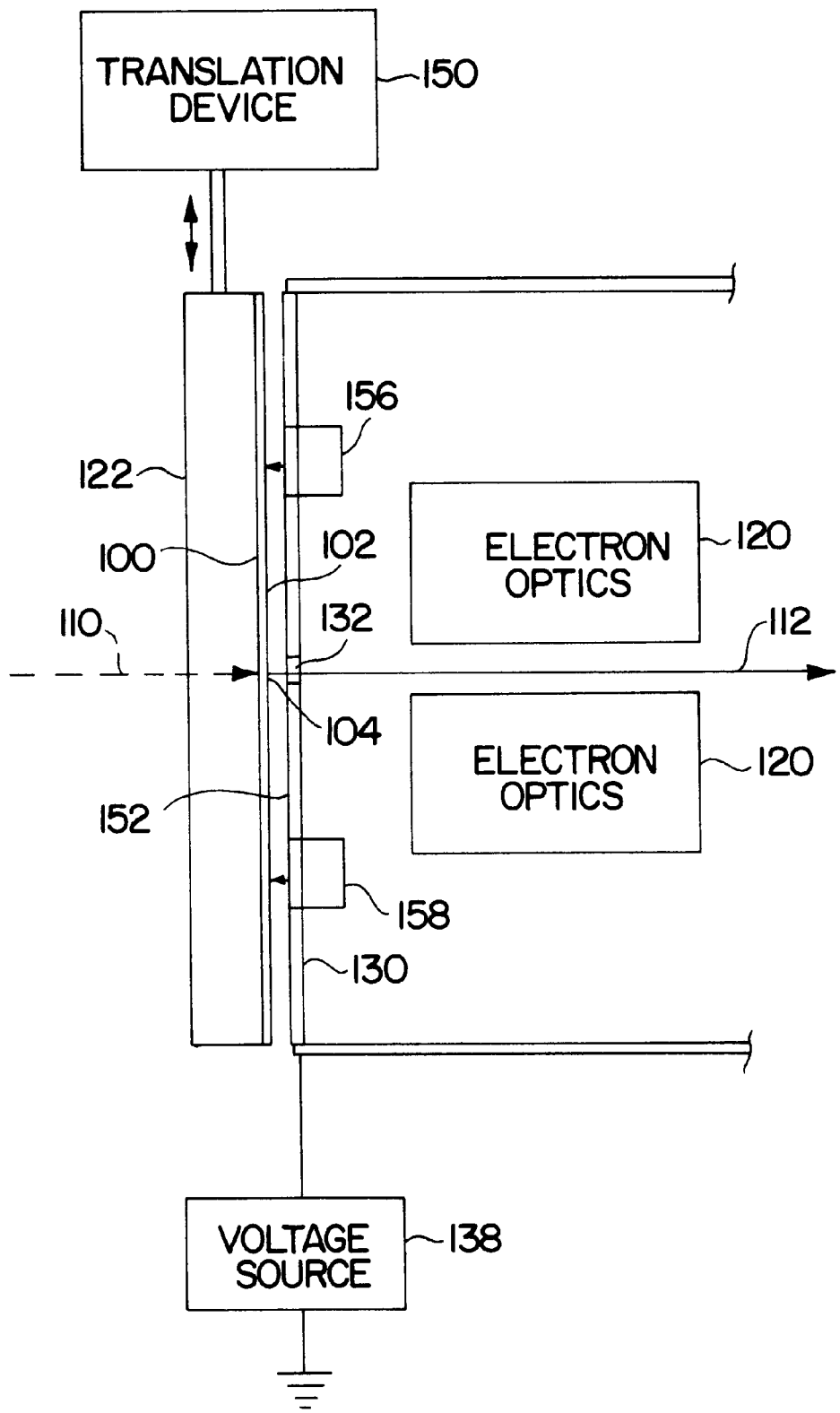
FIG. 3 is a schematic cross-sectional view of an example of an electron beam source incorporating a shield in accordance with the present invention.

A partial cross-sectional schematic diagram of an electron beam source incorporating a cathode shield assembly in accordance with the present invention is shown in FIG. 3. A broad area NEA photocathode 100 may be fabricated as described above. The photocathode 100 includes an electron emission surface 102 having an active emission area 104. A light beam 110, such as a laser beam, is directed at active emission area 104, causing emission of electrons. The electrons are formed into an electron beam 112 by electron optics 120. The photocathode 100 is typically formed on a light-transmissive substrate 122 as described above in connection with FIGS. 1 and 2. During operation, electrons are emitted from active emission area 104, while the remainder of emission surface 102 is non-emitting.

A shield 130 is positioned in proximity to emission surface 102. The shield 130 preferably has an area at least as large as emission surface 102 and includes an opening 132 in alignment with active emission area 104. The opening 132 provides a light-of-sight passage for electron beam 112 between active emission area 104 and the remainder of the electron beam column. The opening 132 should be at least as large as active emission area 104 and may be larger than active emission area 104. In one embodiment, the opening 132 has a diameter of about 1 mm for an active emission area of 1.5 to 30 micrometers. The shield 130 is preferably fabricated of a conductive material and most preferably is a conductive material characterized by low outgassing in high vacuum. Examples of suitable materials include molybdenum and steel. The shield 130 is typically positioned generally parallel to emission surface 102 in closely spaced but non-contact relationship to emission surface 102. In one embodiment, the shield 130 is spaced about 0.5 mm from emission surface 102.

The shield 130 may be electrically connected to a voltage source 138 which applies a bias voltage to the shield. Preferably, the shield 130 is biased at a potential that is approximately equal to the potential of photocathode 100 or at a more negative potential than photocathode 100. When the shield 130 has a negative potential relative to photocathode 100, emission of electrons due to stray light, or so-called dark current emission, is suppressed. Thus, electron-simulated desorption in the vacuum region between the shield and the cathode is avoided. Furthermore, the lack of positive field on the cathode virtually ensures that positive ions will not strike the cathode in these areas. The shield may attract and absorb the impact of ions that would otherwise have struck the cathode and caused its degradation.

The shield 130 inhibits contamination generated by sources in the electron beam column from reaching emission surface 102, except in active emission area 104. Thus, most of emission surface 102 remains uncontaminated and may be used for emission of electrons at a later time when active emission area 104 becomes contaminated or otherwise degrades in performance. In a preferred embodiment, the photocathode 100 is mechanically coupled to a translation device 150. The translation device 150 may, for example, include a shaft connected through a vacuum bellows to an adjustment screw or other adjustment mechanism located externally of the vacuum enclosure. Alternatively, the translation device 150 may be an electrically-actuated positioning device. When the active emission area 104 degrades in performance due to contamination or other causes, the translation device 150 is used to move photocathode 100 relative to opening 132 in shield 132 and relative to light beam 110. This causes a new area of emission surface 102 to become the active emission area. This process may be repeated multiple times until the emission surface 102 of photocathode 100 is effectively used up. This procedure greatly increases the useful life of photocathode 100 as compared with prior art photocathodes. The procedure of moving the photocathode to use new active emission areas is possible because the emission surface 102 is protected against contamination, except in the active emission area.

A further advantage of the shield 130 relates to the activation material typically used on photocathodes. A typical activation material is cesium. As noted above, when cesium escapes from the photocathode and contaminates insulators and electrodes within the electron beam column, the probability of arcing is increased. The shield 130 contains cesium and other activating materials, as well as any other contaminants generated by the cathode, in the vicinity of the emission surface 102 of photocathode 100 and reduces contamination of components within the electron beam column.

A number of additional advantageous features may be incorporated into the cathode shield assembly in accordance with the present invention. In one embodiment, a surface 152 of shield 130 that faces emission surface 102 may incorporate a gettering material for absorbing contaminants that may reach the space between the shield 130 and photocathode 100. Examples of gettering materials include cesium, zirconium matrix non-evaporable getter (NEG) and titanium. In addition, one or more sources of photocathode activating material may be mounted on shield 130. In one example, cesium sources 156 and 158, commonly known as cesium channels, are mounted on shield 130. The cesium sources direct cesium atoms toward emission surface 102 of photocathode 100. In addition, the shield assembly may incorporate a heater, such as one or more heater wires on shield 130, or active cooling, such as a conduit on shield 130 for a passage of a cooling fluid. It will be understood that these features may be utilized separately or in combination, as required for a particular application.

Figure 4:
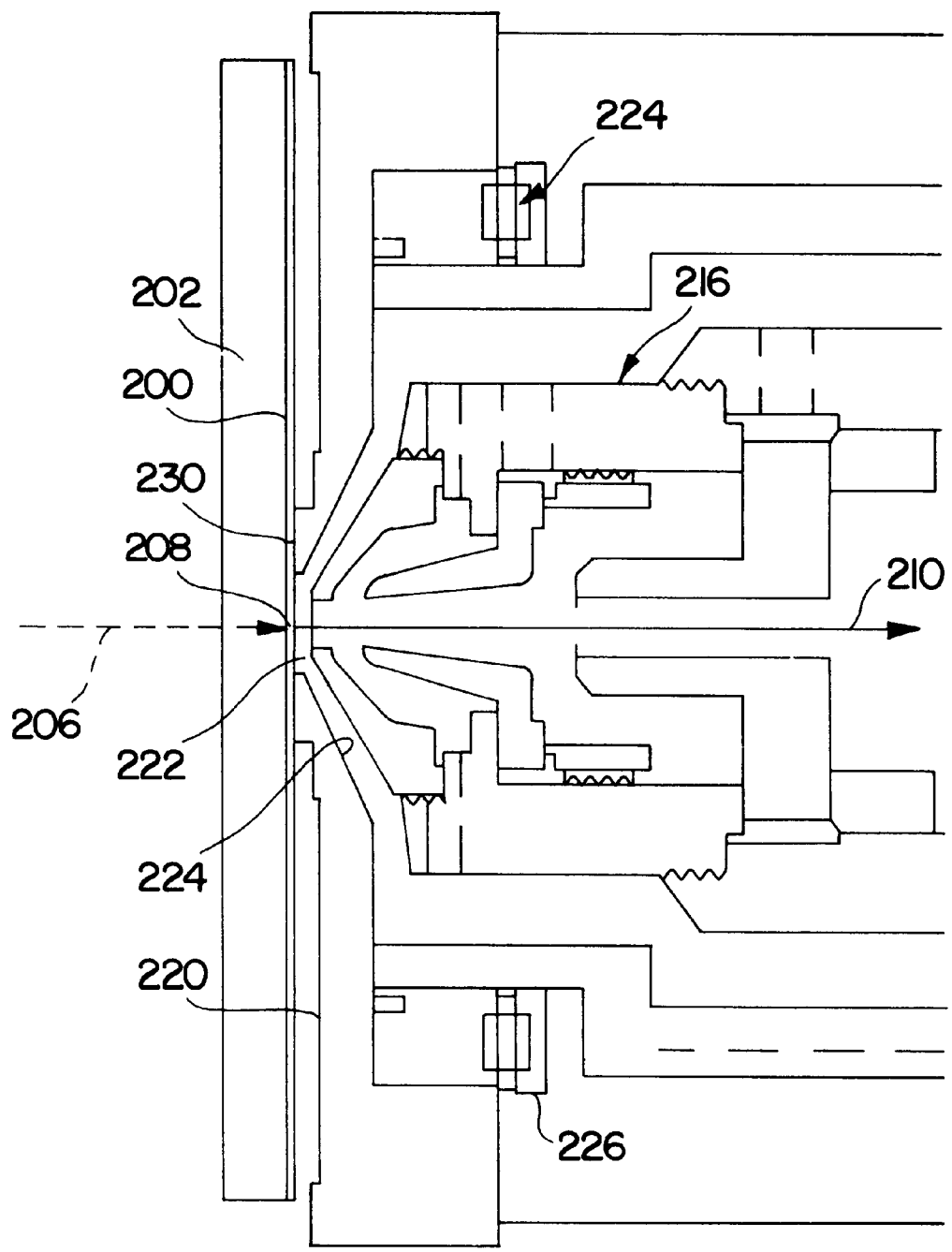
FIG. 4 is a simplified cross-sectional view of an embodiment of an electron beam source incorporating a shield in accordance with the a present invention.

An embodiment of an electron beam source incorporating a cathode shield assembly in accordance with the present invention is shown in FIG. 4. A cathode 200 is disposed on a light-transmissive substrate 202. A light beam 206 is directed at an active emission area 208 of photocathode 200, causing emission of electrons. The emitted electrons are formed into an electron beam 210 by electron optics 216. A shield 220 is disposed in proximity to the emission surface 208 of photocathode 200. The shield 220 has an opening 222 aligned with active emission area 208. In the example of FIG. 4, the shield 220 is fabricated of molybdenum and has cesium sources 224 and 226 mounted therein. The shield 220 has a structure that is advantageous in the operation of the electron beam source. In particular, the shield 220 includes a surface 224 that is frustoconical in shape and is tapered inwardly toward photocathode 200. An annular portion 230 of shield 220 surrounding opening 222 is positioned as close as is practical to photocathode 200, but not contacting photocathode 200. This configuration minimizes any electron optical effect of shield 220 on electron beam 210.

Figure 5:
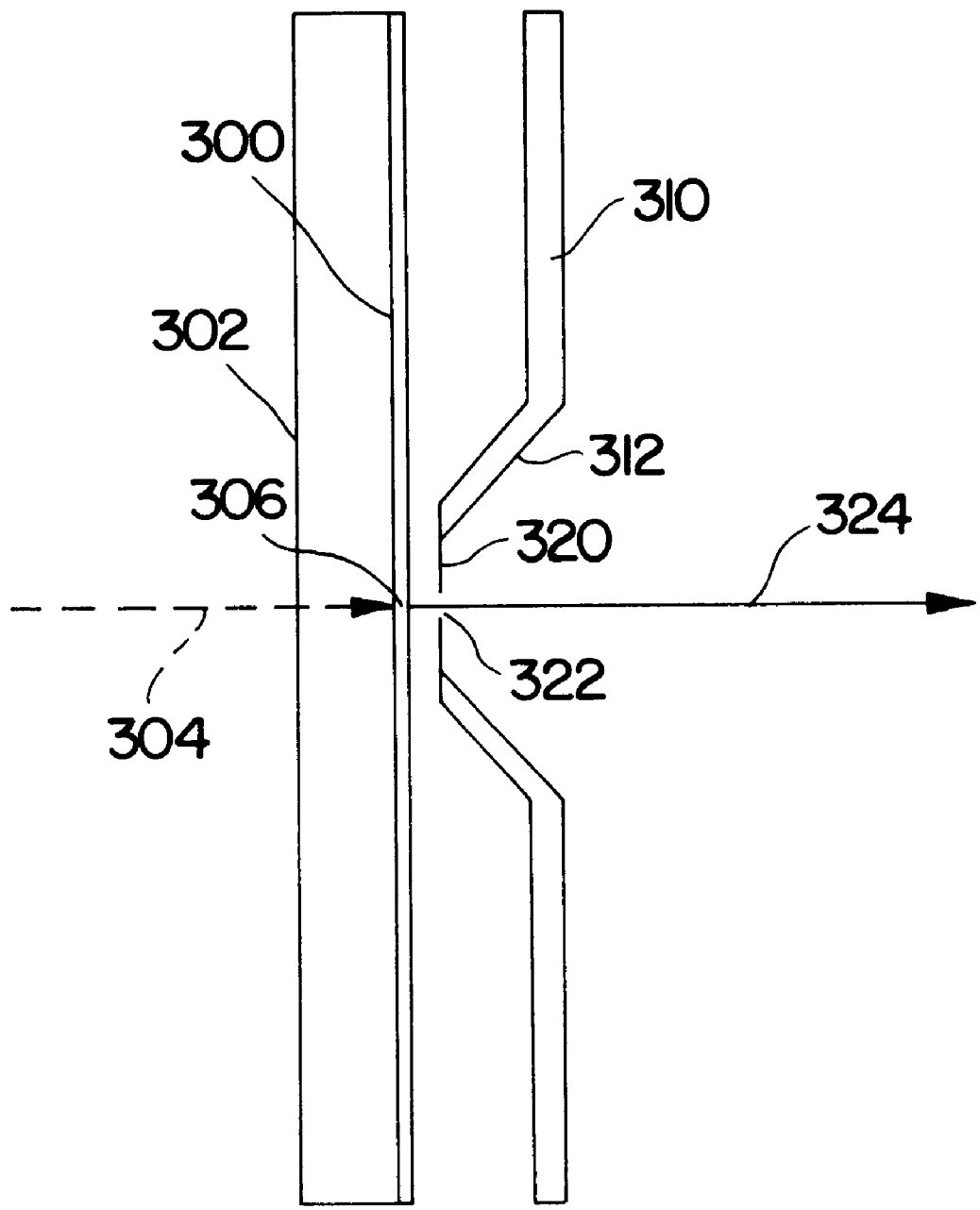
FIG. 5 is a schematic representation of a cathode and a shield, illustrating another embodiment of the invention.

A further embodiment of the cathode shield assembly of the present invention is described with reference to FIG. 5, which shows a simplified schematic representation of a cathode and a shield. A photocathode 300 is disposed on a light-transmissive substrate 302. A light beam 304 is directed at an active emission area 306 of photocathode 300. A shield 310 is positioned in proximity to photocathode 300. The shield 310 includes a portion 312 that is tapered inwardly toward active emission area 306 of photocathode 300. The tapered portion 312 defines an opening that is covered with a thin conductive membrane 320. The membrane 320 has an aperture 322 aligned with active emission area 316. The aperture 322 provides a passage for an electron beam 324 to the electron beam column. The membrane 320 may be replaced in case of damage or when a different diameter aperture is desired.

A shield assembly of the type shown in FIG. 4 and described above was incorporated into an electron beam source. A molybdenum shield having an opening of 1 mm diameter was positioned in proximity to an NEA photocathode. Thus, an area of 1 mm diameter including the emission area had a positive field applied to it and was exposed to contaminants from the electron beam column. The shield assembly included cesium sources and a zirconium matrix NEG getter as described above. The shield was spaced from the photocathode by approximately 0.5 mm. The active emission area was illuminated by laser energy, and delivered an electron current of about 30 nanoamperes down the electron beam column. In this system, it was found that during operation of the photocathode, emission decayed at a rate of about 0.15% per hour. The area that experienced decay was limited to the area exposed through the opening in the shield (1 mm diameter). Outside this area, the ability of the cathode to emit electrons was unimpaired. Since the cathode has to be moved only a small distance, approximately 0.5 mm in this example, to obtain emission from a fresh area of the cathode, for an 18 mm diameter cathode, the lifetime can be extended by over 500 times.

The invention has been described thus far in connection with an NEA photocathode. However, the shield of the present invention may be utilized with any cathode and is not limited to photocathodes. For example, electron emission may be stimulated by application of a suitable voltage. In general, a shield is located in proximity to a cathode, typically a broad area cathode. The shield has an opening aligned with an active emission area of the cathode. The shield protects non-emitting areas of the cathode from contamination and contains cathode materials, so that they are inhibited from contaminating other components of the electron beam column. Cathode life is significantly extended by translating the cathode relative to the opening in the shield when emission from the active area is degraded.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An electron beam source comprising:
   a cathode having an electron emission surface including an active area for emission of electrons, said emission surface being larger than said active area;
   a cathode shield assembly comprising a conductive shield disposed in proximity to the electron emission surface of said cathode, said shield having an opening substantially directly aligned with said active area;

means for accelerating emitted electrons in a direction substantially perpendicular to the emission surface of said cathode from said active area of said cathode;

electron optics for forming the electrons emitted from said active area of said cathode into an electron beam; and a vacuum enclosure for maintaining said cathode at high vacuum.

2. An electron beam source as defined in claim 1 wherein said cathode comprises a negative electron affinity photocathode on a light-transmissive substrate and wherein said means for stimulating comprises a light beam generator for directing a light beam through said light-transmissive substrate at the active area of said photocathode.

3. An electron beam source as defined in claim 1 wherein said shield comprises a material selected from the group consisting of molybdenum and steel.

4. An electron beam source as defined in claim 1 wherein said shield is mounted in spaced relationship to the electron emission surface of said cathode.

5. An electron beam source as defined in claim 1 wherein said shield assembly includes a getter material on a surface of said shield facing said cathode.

6. An electron beam source as defined in claim 5 wherein said getter material is selected from the group consisting of cesium, zirconium matrix non-evaporable getter, titanium and combinations thereof.

7. An electron beam source as defined in claim 1 wherein said shield assembly includes means for biasing said shield at a potential approximately equal to the potential of said cathode.

8. An electron beam source as defined in claim 1 wherein said shield assembly includes means for biasing said shield at a potential that is more negative than the potential of said cathode.

9. An electron beam source as defined in claim 1 wherein said shield assembly includes a source of activation material for providing activation material to the electron emission surface of said cathode.

10. An electron beam source as defined in claim 9 wherein said source of activation material comprises a cesium source.

11. An electron beam source as defined in claim 1 further including means for moving said cathode relative to the opening in said shield so as to align a new active area with the opening.

12. An electron beam source as defined in claim 1 wherein said shield assembly includes a conductive membrane covering the opening in said shield, said membrane having an aperture aligned with said active area.

13. An electron beam source as defined in claim 1 wherein said shield assembly includes means for heating said shield.

14. An electron beam source as defined in claim 1 wherein said shield assembly includes means for cooling said shield.

15. An electron beam source comprising:

a negative electron affinity photocathode on a light-transmissive substrate, said photocathode having a conduction band and an electron emission surface including an active area as a portion thereof for emission of electrons;

a cathode shield assembly comprising a shield disposed in proximity to the electron emission surface of said photocathode, said shield having an opening substantially directly aligned with said active area;

a light beam generator for directing a light beam through said light-transmassive substrate at the active area of said photocathode for exciting electrons into the conduction band of said photocathode;

electron optics for accelerating emitted electrons in a direction substantially perpendicular to the emission surface of said photocathode forming the electrons emitted from the active area of said photocathode into an electron beam; and a vacuum enclosure for maintaining said photocathode at high vacuum such that electrons in the conduction band of said photocathode have higher energies than electrons in the vacuum enclosure adjacent to said photocathode and have a high probability of emission into the vacuum enclosure from the active area of said photocathode.

16. An electron beam source as defined in claim 15 wherein said shield comprises a material selected from the group consisting of molybdenum and steel.

17. An electron beam source as defined in claim 15 wherein said shield assembly includes a getter material on a surface of said shield facing said photocathode.

18. An electron beam source as defined in claim 17 wherein said getter material is selected from the group consisting of cesium, zirconium matrix non-evaporable getter, titanium and combinations thereof.

19. An electron beam source as defined in claim 15 wherein said shield assembly includes means for biasing said shield at a potential approximately equal to the potential of said photocathode.

20. An electron beam source as defined in claim 15 wherein said shield assembly includes means for biasing said shield at a potential that is more negative than the potential of said photocathode.

21. An electron beam source as defined in claim 15 wherein shield assembly includes a source of activation material for providing activation material to the electron emission surface of said photocathode.

22. An electron beam source as defined in claim 21 wherein said source of activation material comprises a cesium source.

23. An electron beam source as defined in claim 15 further including a translation device for moving said photocathode relative to the opening in said shield so as to align new active area with the opening.

24. An electron beam source as defined in claim 15 wherein said shield assembly includes a conductive membrane covering the opening in said shield, said membrane having an aperture aligned with said active area.

25. An electron beam source as defined in claim 15 wherein said shield assembly includes means for heating said shield.

26. An electron beam source as defined in claim 15 wherein said shield assembly includes means for cooling said shield.

* * * * *